United States Patent
Karhade et al.

(10) Patent No.: US 9,041,205 B2
(45) Date of Patent: May 26, 2015

(54) RELIABLE MICROSTRIP ROUTING FOR ELECTRONICS COMPONENTS

(71) Applicants: Omkar G. Karhade, Chandler, AZ (US); Nevin Altunyurt, Chandler, AZ (US); Kyu Oh Lee, Chandler, AZ (US); Krishna Bharath, Chandler, AZ (US)

(72) Inventors: Omkar G. Karhade, Chandler, AZ (US); Nevin Altunyurt, Chandler, AZ (US); Kyu Oh Lee, Chandler, AZ (US); Krishna Bharath, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/930,086

(22) Filed: Jun. 28, 2013

(65) Prior Publication Data

US 2015/0001733 A1 Jan. 1, 2015

(51) Int. Cl.
| | |
|---|---|
| H01L 23/48 | (2006.01) |
| H01L 23/52 | (2006.01) |
| H01L 29/40 | (2006.01) |
| H01L 23/04 | (2006.01) |
| H01L 23/538 | (2006.01) |
| H01L 23/522 | (2006.01) |
| H01L 23/485 | (2006.01) |
| H01L 23/498 | (2006.01) |

(52) U.S. Cl.
CPC .......... *H01L 23/538* (2013.01); *H01L 23/5226* (2013.01); *H01L 23/485* (2013.01); *H01L 23/49838* (2013.01); *H01L 2224/45147* (2013.01); *H01L 2924/14* (2013.01)

(58) Field of Classification Search
CPC ............ H01L 23/485; H01L 23/49838; H01L 2224/45147; H01L 2924/14
USPC .......... 257/690, 691, 730, 758, 786, E23.019
See application file for complete search history.

(56) References Cited

U.S. PATENT DOCUMENTS

| | | | | |
|---|---|---|---|---|
| 4,705,917 | A * | 11/1987 | Gates et al. ................... | 174/541 |
| 5,343,074 | A * | 8/1994 | Higgins et al. ................ | 257/668 |
| 5,406,700 | A * | 4/1995 | Ito ................................. | 29/827 |
| 5,639,989 | A * | 6/1997 | Higgins, III .................. | 174/386 |
| 5,990,547 | A * | 11/1999 | Sharma et al. ................ | 257/700 |
| 6,225,146 | B1 * | 5/2001 | Yamaguchi et al. .......... | 438/123 |
| 6,521,987 | B1 * | 2/2003 | Glenn et al. ................... | 257/684 |
| 6,864,565 | B1 * | 3/2005 | Hool et al. .................... | 257/666 |
| 7,256,475 | B2 * | 8/2007 | Jao et al. ....................... | 257/622 |
| 7,341,887 | B2 * | 3/2008 | Wong et al. ................... | 438/106 |
| 7,755,182 | B2 * | 7/2010 | Moriyama et al. ............ | 257/691 |
| 7,791,210 | B2 * | 9/2010 | Miller et al. .................. | 257/780 |
| 8,159,052 | B2 * | 4/2012 | Lao et al. ...................... | 257/666 |
| 8,710,630 | B2 * | 4/2014 | Chen ............................. | 257/618 |
| 2007/0222084 | A1 * | 9/2007 | Hall et al. ..................... | 257/777 |
| 2009/0190254 | A1 * | 7/2009 | Jandric et al. ................. | 360/110 |
| 2010/0271131 | A1 * | 10/2010 | Staszewski et al. ........... | 330/253 |
| 2010/0285637 | A1 * | 11/2010 | Khan et al. .................... | 438/122 |
| 2011/0254150 | A1 * | 10/2011 | Takahashi et al. ............. | 257/734 |
| 2011/0309483 | A1 * | 12/2011 | Tadaoka ........................ | 257/673 |
| 2014/0117552 | A1 * | 5/2014 | Qian et al. ..................... | 257/762 |

* cited by examiner

*Primary Examiner* — Ida M Soward
(74) *Attorney, Agent, or Firm* — Blakely, Sokoloff, Taylor & Zafman LLP (57) ABSTRACT

A semiconductor apparatus includes a semiconductor die having a surface with an integrated circuit thereon coupled to contact pads of an uppermost metallization layer of a semiconductor package substrate by a plurality of conductive contacts. A plurality of discrete metal planes is disposed at the uppermost metallization layer of the semiconductor package substrate, each metal plane located, from a plan view perspective, at a corner of a perimeter of the semiconductor die. Microstrip routing is disposed at the uppermost metallization layer of the semiconductor package substrate, from the plan view perspective, outside of the perimeter of the semiconductor die.

8 Claims, 6 Drawing Sheets

RELIABLE MICROSTRIP ROUTING FOR ELECTRONICS COMPONENTS

TECHNICAL FIELD

Embodiments of the invention are in the field of semiconductor packages and, in particular, reliable microstrip routing for electronics components.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

Controlled Collapse Chip Connections (C4) solder ball connections have been used for many years to provide flip chip interconnections between semiconductor devices and substrates. A flip chip or C4 interconnection is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate. However, this approach may be limited by the size of the mounting area and may not readily accommodate stacked die.

On the other hand, conventional wire-bonding approaches may limit the number of semiconductor die that can reasonably be included in a single semiconductor package. Furthermore, general structural issues may arise when attempting to package a large number of semiconductor die in a semiconductor package.

Newer packaging and die-to-die interconnect approaches, such as through silicon via (TSV) and silicon interposer, are gaining much attention from designers for the realization of high performance Multi-Chip Module (MCM) and System in Package (SiP). However, additional improvements are needed in the evolution of semiconductor packages and die-to-die interconnection approaches.

DESCRIPTION OF THE EMBODIMENTS

Reliable microstrip routing for electronics components is described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to approaches for, and the resulting structures of, fabricating microstrip routing on server and other high performance products. Embodiments may, but need not, pertain to one or more of epoxy, fillet crack, microstrip structures, and stripline products.

To provide a general context, server and other high performance products have typically incorporated stripline routing instead of microstrip routing. On reason for doing so is that stripline routing can provide superior far-end crosstalk (FEXT) performance, e.g., reduced cross-talk, and high thermomechanical reliability. From an electrical performance perspective, the superiority of stripline transmission lines can be due at least in part to the phenomenon that stripline configuration can support a balanced wave propagation of even and odd modes leading to theoretically zero FEXT.

Figure 1:
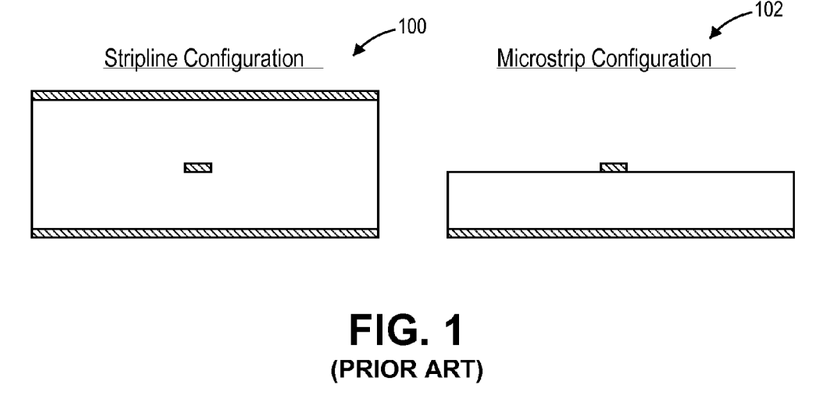
FIG. 1 illustrates cross-sectional views of a stripline configuration and a microstrip configuration for transmission lines, in accordance with the prior art.

For the sake of providing visual context, FIG. 1 illustrates cross-sectional views of a stripline configuration 100 and a microstrip configuration 102 for transmission lines, in accordance with the prior art. Referring to FIG. 1, stripline routing 100 in a package requires three package layers compared to the two-layer routing topology of microstrip lines 102. As such, although performance benefits have been realized with stripline routing 100, a stripline topology adds cost to the overall package manufacturing and assembly.

Recently, microstrip stubby line routing has been proposed as a solution to eliminate FEXT issues associated with package and socket technologies. It has been demonstrated through simulation data that stubby microstrip lines can show an improvement of 5-10 ticks (1 tick is approximately 12 mV) over conventional microstrip lines. However, although stubby lines can enable microstrip routing from an electrical performance perspective, a process solution is needed to enable microstrip routing on server and other high performance products while still achieving thermomechanical reliability.

A copper (Cu) ground plane disposed on a surface layer of a package can act as a crack propagation barrier. Typically, cracks in server package begin at epoxy fillet corners (e.g., at a highest distance from neutral point (DNP)) and extend down to the solder resist and to the Cu surface layer in an underlying substrate. The ground Cu plane on the surface layer in a stripline routing can prevent crack propagation to layers underneath and can also prevent electrical failure. In microstrip routing, however, the surface layer has Cu traces which can crack and cause opens.

A ground plane also enables a solder resist trench to limit epoxy spread. For example, server products require a substantial amount of epoxy volume for reliability (e.g., spreading as much as approximately 3-4 millimeters away from a die). The solder resist trench can aid in stopping epoxy from spreading further due to sharp steps acting as a surface tension barrier. As the solder resist trench reveals Cu underneath, microstrip routing cannot typically be enabled to avoid live traces open to air catching dust or dirt, and causing shorts.

Figure 2:
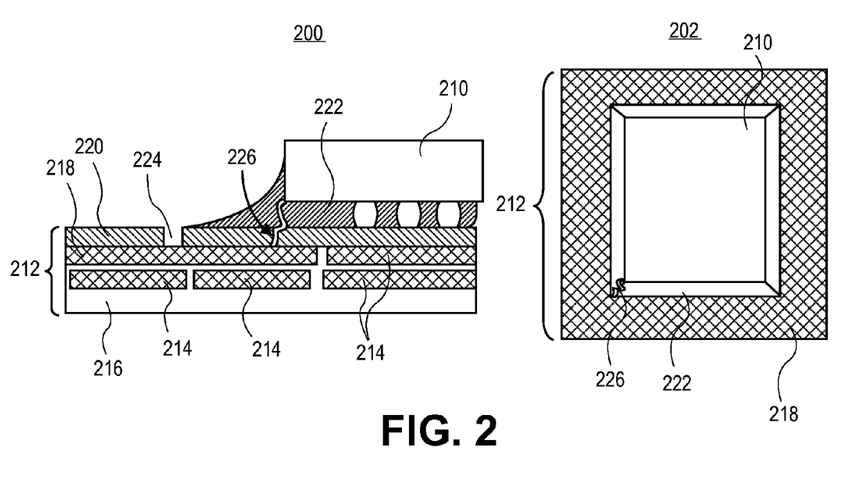
FIG. 2 illustrates a cross-sectional view and a plan view of a packaged die having an epoxy fillet crack.

As an example to highlight issues with state of the art approaches, in FIG. 2, a cross-sectional view 200 and a plan view 202 of a packaged die having an epoxy fillet crack is illustrated. Referring to FIG. 2, a die 210 is flip-chip bonded to a substrate 212. The substrate 212 includes metal routing layers 214 and dielectric layers 216, as well as a copper plane 218. The die 210 is adhered to a solder resist 220 atop the substrate 212 by an epoxy fillet layer 222. A solder resist trench 224 provides a keep out zone (KOZ) to limit epoxy fillet flow. The copper plane 218 can be used to stop propagation of cracks, such as epoxy fillet crack 226, that can form due to thermal stresses. That is, the copper plane 218 in the surface layer arrests fillet crack propagation and also allows a solder resist trench to define an epoxy keep out zone.

Referring again to FIG. 2, the copper plane 218 surrounds the entire perimeter of the die 210, limiting routing 214 to regions below die 210 and below the copper plane 218. Current approaches for server and other high performance products involve the use of stripline routing to overcome the aforementioned risks. Process solutions enabling microstrip routing on server products, however, are needed for cots considerations, etc.

Figure 3A:
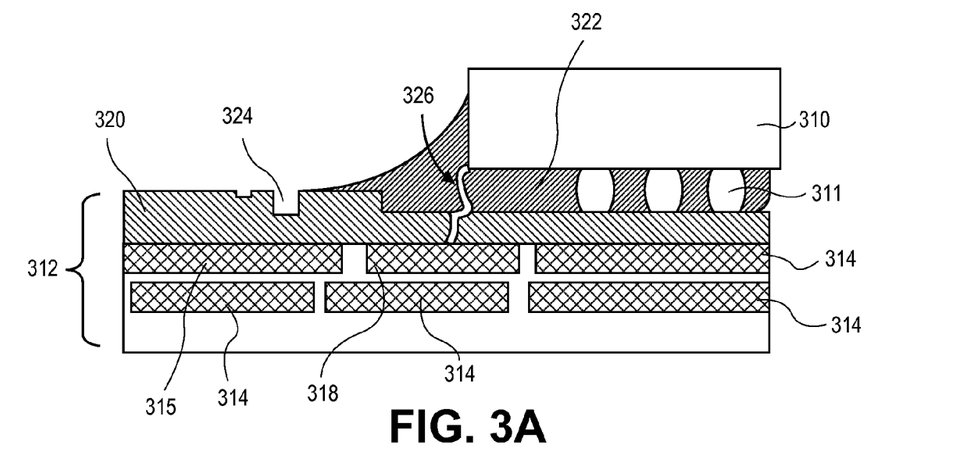
FIG. 3A illustrates a cross-sectional view of a packaged die having microstrip routing and a metal plane to accommodate for an epoxy fillet crack, in accordance with an embodiment of the present invention.
Figure 3B:
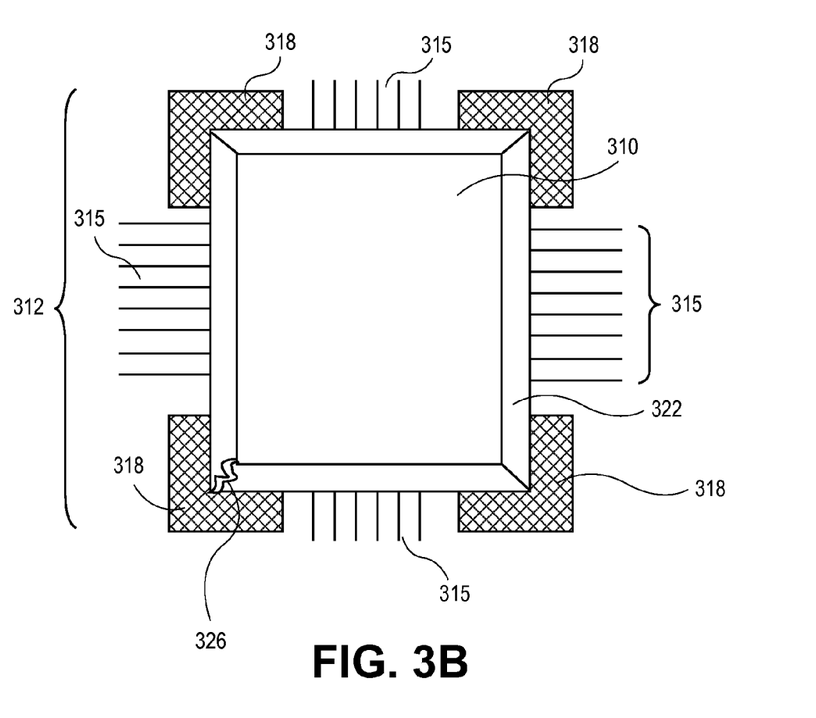
FIG. 3B illustrates a plan view of a packaged die having microstrip routing and a metal plane to accommodate for an epoxy fillet crack, in accordance with an embodiment of the present invention.

Addressing one or more of the above mentioned issues with state of the art packaging and routing options, FIGS. 3A and 3B illustrate a cross-sectional view and a plan view, respectively, of a packaged die having microstrip routing and a metal plane to accommodate for an epoxy fillet crack, in accordance with an embodiment of the present invention.

Referring to FIGS. 3A and 3B, a die 310 is flip-chip bonded to a substrate 312, e.g., through solder balls or metal bumps 311 (such as a ball grid array (BGA)). The substrate 312 includes metal routing layers 314, as well as microstrip routing 315 outside of the periphery of the die 310, and dielectric layers 216. A plurality of metal planes 318, e.g. copper planes, is also included, but each plane located only at the corners of the die 310, with respect to the plan view. The die 310 is adhered to a solder resist 320 atop the substrate 312 by an epoxy fillet layer 322. A solder resist trench 324 provides a keep out zone (KOZ) to limit epoxy fillet flow. The metal planes 318 can be used to stop propagation of cracks, such as epoxy fillet crack 326, that can form due to thermal stresses. That is, in accordance with an embodiment of the present invention, the metal planes 218 in the surface layer arrest fillet crack propagation.

Referring again to FIGS. 3A and 3B, in an embodiment, the metal planes 318, such as copper planes, can be used to arrest corner fillet cracks without surrounding the entire perimeter of the die 310. That is, in one embodiment, the copper planes are discrete since they are non-continuous with one another and are located only in the corners to arrest the cracks that typically form at a furthest distance from the center of the die. As such, reliability of the package can be maintained. As such, in an embodiment, microstrip routing is provided in the surface layer of the substrate except at the die corners. As such, in one embodiment, one substrate layer can be reduced (on both sides), aiding in reducing of package thickness substrate processing costs.

Referring again to FIGS. 3A and 3B, in an embodiment, epoxy fillet spread can be arrested by a trench 324 formed partially into, but not totally through, the solder resist mask 320. In this way, microstrip routing 315 is not exposed by the trench 324. In one such embodiment, two solder resist (SR) layers can be used together to provide a structure such as the structure illustrated in FIG. 3A. The trench 324 is fabricated only in the top layer to stop epoxy spread. The second, overlying, SR layer can be processed after fully curing the first SR layer. In another such embodiment, a second SR layer can be etched such a way that the layer only covers the region outside of an epoxy keep out zone (KOZ). The layer can be fabricated from low surface energy material such that it acts as a surface energy barrier. In yet another embodiment, a sharper solder resist taper angle (e.g., greater than 90 degrees) is used as a surface tension barrier. Other possibilities for limiting epoxy spread include, but are not limited to, low surface energy material employed as a surface energy barrier to stop epoxy flow instead of the use of a solder resist trench, laser etching employed to partially remove solder resist to stop epoxy, and use of a high viscosity material barrier.

In reference again to FIGS. 3A and 3B, in an embodiment, surface routing is enabled without compromising reliability or process requirements. In one such embodiment, such approaches for surface routing are applicable to a variety of microchip packaging design and fabrication approaches. Embodiments may be detectable through visual inspection of a solder resist layer, epoxy fillet and/or surface routing in a package substrate. In one embodiment, such enabling of microstrip routing provides a significant cost reduction opportunity by reducing the package layer count.

Thus, one or more embodiments described herein relate to substrate routing structures in which microstrip routing is enabled while utilizing a minimum number of layers and, possibly, without an increase in the surface area of the substrate or die. Implementations include applications in high performance microprocessor (e.g., server) packages, multichip packages, organic package substrates, transmission lines, 2.5 D (Si feature between die and board), on-die, on package, etc. architectures. More generally, embodiments described herein may have far reaching implementations for CPUs/processors, multi-chip/3D packaging including CPU in combination with other devices, memory (e.g., flash/

DRAM/SRAM, etc. Several non-limiting examples are provided below. Application may be particularly useful for flip chip, controlled collapse chip connection (C4) and/or ball grid array (BGA) implementations.

In a first general example, an example of which is illustrated in FIG. 3, in accordance with an embodiment of the present invention, a die is coupled to a flexible substrate or a rigid substrate, depending upon the specific application. The substrate has a plurality of electrical traces disposed therein. In an embodiment, an external contact layer is also formed. In one embodiment, the external contact layer includes a ball grid array (BGA). In other embodiments, the external contact layer includes an array such as, but not limited to, a land grid array (LGA) or an array of pins (PGA). Regions for inclusion of discrete metal planes to arrest crack propagation, as well as regions for outer-die-perimeter microstrip routing are provided in the package substrate. Additionally, a partial trench may be included in a solder mask to provide a keep out zone for epoxy fillet flow, e.g., during underfill.

Figure 4A:
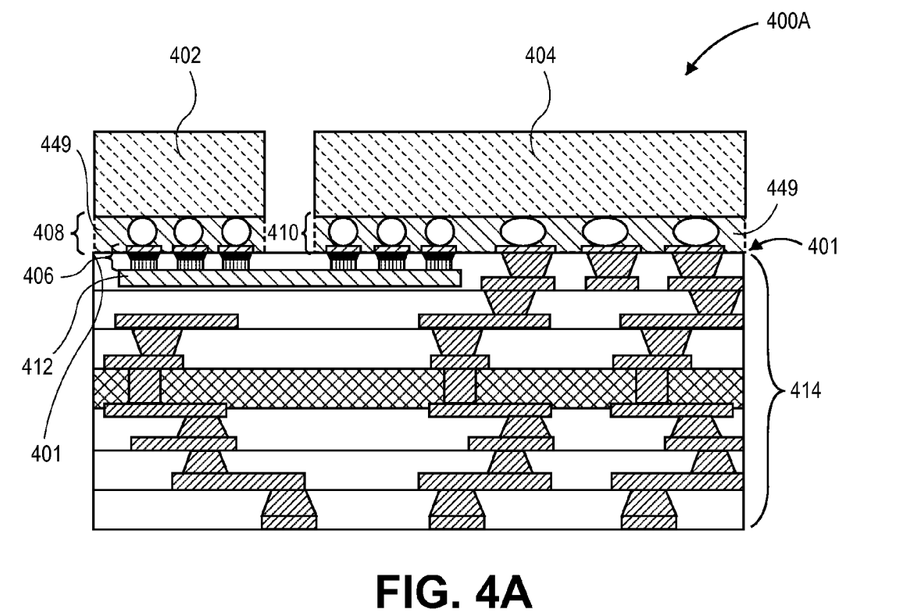
FIG. 4A illustrates a cross-sectional view of a semiconductor package including multiple die coupled with an embedded interconnect bridge (EmIB) and including microstrip routing and a metal plane to accommodate for an epoxy fillet crack, in accordance with an embodiment of the present invention.

In another example implementation, FIG. 4A illustrates a cross-sectional view of a semiconductor package 400A including multiple die coupled with an EmIB and including microstrip routing and a metal plane to accommodate for an epoxy fillet crack, in accordance with an embodiment of the present invention. Referring to FIG. 4A, the semiconductor package 400A includes a first die 402 (such as a CPU, memory chipset, etc.) and a second die 404 (such as a CPU, memory chipset, etc.). The first die 402 and second die 404 are coupled to an EmIB 406 through bumps 408 and 410 of the first die 402 and second die 404, respectively, and bond pads 412 of the silicon bridge, e.g., by thermal compression bonding (TCB). The first die 402, second die 404, and EmIB 406 are included with additional routing layers 414, as depicted in FIG. 4A. The additional routing layers may be simple or complex and may be for coupling to other packages or may form part or all of an organic package or printed circuit board (PCB), etc. An epoxy-fillet material 449 is included between the first die 402 and the EmIB 412/structure 414 interface and between the second die 404 and the EmIB 412/structure 414 interface. In one embodiment, regions 401 for inclusion of discrete metal planes to arrest crack propagation, as well as regions for outer-die-perimeter microstrip routing are provided in the structure 414. Additionally, a partial trench may be included in a solder mask to provide a keep out zone for epoxy fillet flow, e.g., during underfill. In an embodiment, a silicon bridge is used and is not embedded in the package, but rather in an open cavity.

Figure 4B:
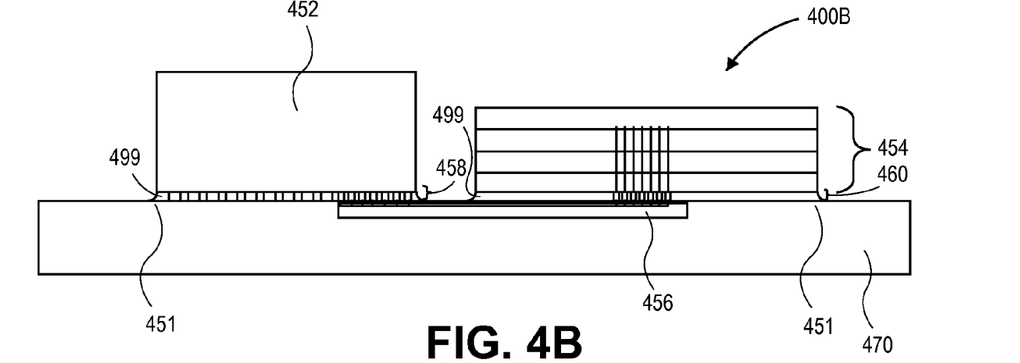
FIG. 4B illustrates a cross-sectional view of a semiconductor package including multiple die coupled with an embedded interconnect bridge (EmIB) and including microstrip routing and a metal plane to accommodate for an epoxy fillet crack, in accordance with an embodiment of the present invention.

In another example implementation, FIG. 4B illustrates a cross-sectional view of a semiconductor package 400B including multiple die coupled with an embedded interconnect bridge (EmIB) and including microstrip routing and a metal plane to accommodate for an epoxy fillet crack, in accordance with an embodiment of the present invention. Referring to FIG. 4B, the semiconductor package 400B includes a first die 452 (such as a central processing unit, CPU) and a second die 454 (such as an additional CPU or a memory die or memory die stack, the memory die stack depicted in FIG. 4B). The first die 452 and second die 454 are coupled to an EmIB 456 through bumps 458 and 460 of the first die 452 and second die 454, respectively, e.g., by thermal compression bonding (TCB). The EmIB 456 is embedded in a substrate (e.g., flexible organic substrate) or board (such as epoxy PCB material) material 470, as depicted in FIG. 4B. An epoxy fillet material 499 is included between the first die 452 and the EmIB 456/substrate 470 interface and between the second die 454 and the EmIB 456/substrate 470 interface. In one embodiment, regions 451 for inclusion of discrete metal planes to arrest crack propagation, as well as regions for outer-die-perimeter microstrip routing are provided in the substrate 470. Additionally, a partial trench may be included in a solder mask to provide a keep out zone for epoxy fillet flow, e.g., during underfill.

Figure 5:
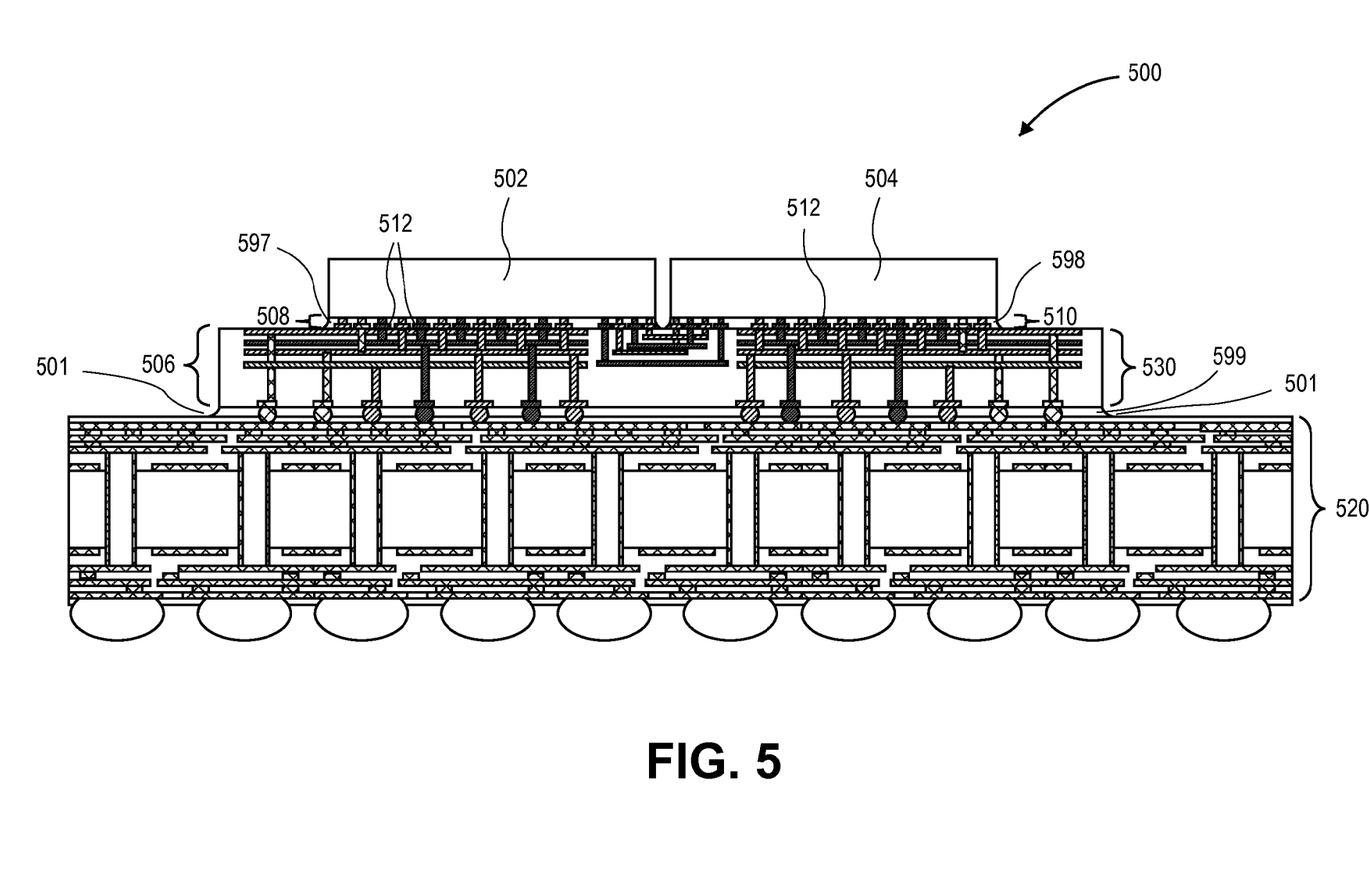
FIG. 5 illustrates a cross-sectional view of a semiconductor package including multiple die coupled with an interposer and including microstrip routing and a metal plane to accommodate for an epoxy fillet crack, in accordance with an embodiment of the present invention.

Embodiments of the present invention may also be applicable for an interposer structure. For example, FIG. 5 illustrates a cross-sectional view of a semiconductor package 500 including multiple die coupled with an interposer and including microstrip routing and a metal plane to accommodate for an epoxy fillet crack, in accordance with an embodiment of the present invention. Referring to FIG. 5, the semiconductor package 500 includes a first die 502 and a second die 504. The first die 502 and second die 504 are coupled to an interposer 506, such as a silicon interposer. The first die 502 and second die 504 are coupled to the interposer 506 through bumps 508 and 510 of the first die 502 and second die 504, respectively, and bond pads 512 of the interposer 506, e.g., by thermal compression bonding (TCB). The interposer 506 couples the first die 502 and second die 504 with an organic package 520. The organic package 520 may include its own routing layers, as depicted in FIG. 5. Coupling through interposer 506 may be achieved by use of through silicon vias (TSVs) 530, as is also depicted in FIG. 5. In an embodiment, as depicted, possible locations for including an epoxy fillet material 597, 598 or 598 include between the first die 502 and interposer 506, between the second die 504 and interposer 506, and between the interposer 506 and package 520. In one embodiment, regions 501 for inclusion of discrete metal planes to arrest crack propagation from the interposer 506, as well as regions for outer-interposer-perimeter microstrip routing are provided in the organic package 520. Additionally, a partial trench may be included in a solder mask to provide a keep out zone for epoxy fillet flow, e.g., during underfill. It is to be understood that glass or other material may be used in place of silicon for an interposer structure.

In another aspect, various 3D integrated circuit packages with through-mold first level interconnects and including an epoxy fillet material are described, in accordance with embodiments of the present invention.

Figure 6:
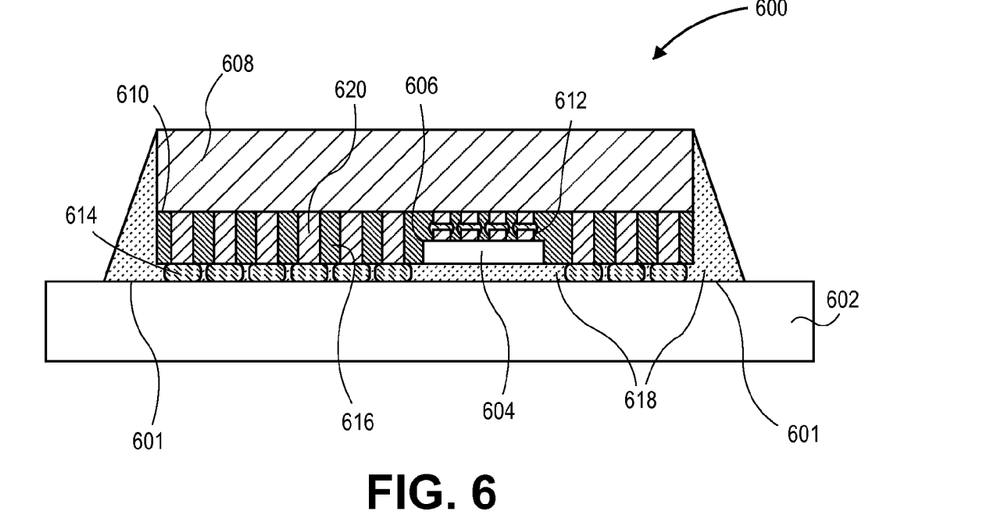
FIG. 6 illustrates a cross-sectional view of a 3D integrated circuit package with through-mold first level interconnects and including microstrip routing and a metal plane to accommodate for an epoxy fillet crack, in accordance with an embodiment of the present invention.

In a first example, referring to FIG. 6, a semiconductor package 600 includes a substrate 602. A bottom semiconductor die 604 has an active side 606 with a surface area. The bottom semiconductor die 604 is coupled to the substrate 602 with the active side 606 distal from the substrate 602. A top semiconductor die 608 has an active side 610 with a surface area larger than the surface area of the bottom semiconductor die 604. The top semiconductor die 608 is coupled to the substrate 602 with the active side 610 proximate to the substrate 602. The active side 606 of the bottom semiconductor die 604 is facing and conductively coupled to the active side 610 of the top semiconductor die 608 by die to die interconnect structures 612 (e.g., composed of soldered bumps from each of the die). The top semiconductor die 608 is conductively coupled to the substrate 602 by first level interconnects 614 that bypass the bottom semiconductor die 604. The top semiconductor die 608 is further conductively coupled to the substrate 602 by a plurality of bumps 620 (e.g., tall copper bumps) that extend from the active side 610 of the top semiconductor die 608 and adjacent to the bottom semiconductor die 604. The plurality of bumps 620 is coupled to the first level interconnects 614. In an embodiment, the bottom semiconductor die 604 and the plurality of bumps 620 are housed in a molding layer 616, as depicted in FIG. 6. In an embodiment, the top semiconductor die 608 and the bottom semiconductor die 604 are further coupled to the substrate 602 by an epoxy fillet material 618, as is also depicted in FIG. 6. In one embodiment, regions 601 for inclusion of discrete metal planes to arrest crack propagation, as well as regions for outer-die-perimeter microstrip routing are provided in the substrate 602. Additionally, a partial trench may be included in a solder mask to provide a keep out zone for epoxy fillet flow, e.g., during underfill.

In an embodiment, the top semiconductor die 608 is configured to provide power to the bottom semiconductor die 604. In an embodiment, the top semiconductor die 608 is configured to facilitate communication between the bottom semiconductor die 604 and the substrate 604, e.g., through routing in the substrate 608. In an embodiment, the bottom semiconductor die 604 has no through silicon vias (TSVs). Thus, connection between the bottom die 604 and substrate 602 is achieved indirectly through interconnect lines on the top die 608 as well as the FLI bumps 614. It is to be understood, however, that in an alternative embodiment, a bottom die may be connected directly by using TSV on the bottom die.

Thus, in reference to FIG. 6, for a 3D IC with through-mold FLI, bottom and top active die are stacked face-to-face. No TSV may be necessary to achieve such 3D IC stacking FLI copper bumps are embedded in a molding layer. The top and bottom die have a common interface underfilled by the molding compound. Fabrication-wise, the final 3D IC stacked die with through mold first level interconnect (FLI) is attached to a package substrate, under-filled, and subsequently assembled.

One or both of the semiconductor die 604 or 608 may be formed from a semiconductor substrate, such as a single crystalline silicon substrate. Other materials, such as, but not limited to, group III-V material and germanium or silicon germanium material substrates may also be considered. The active side (606 or 610, respectively) of the semiconductor die 604 or 608 may be the side upon which semiconductor devices are formed. In an embodiment, the active side 606 or 610 of the semiconductor die 604 or 608, respectively, includes a plurality of semiconductor devices, such as but not limited to transistors, capacitors and resistors interconnected together by a die interconnection structure into functional circuits to thereby form an integrated circuit. As will be understood to those skilled in the art, the device side of the semiconductor die includes an active portion with integrated circuitry and interconnections. The semiconductor may be any appropriate integrated circuit device including but not limited to a microprocessor (single or multi-core), a memory device, a chipset, a graphics device, an application specific integrated circuit according to several different embodiments.

Stacked die apparatus 600 may be particularly suitable for packaging a memory die with a logic die. For example, in an embodiment, one of die 604 or 608 is a memory die. The other die is a logic die. In an embodiment of the present invention, the memory die is a memory device, such as but not limited to a static random access memory (SRAM), a dynamic access memory (DRAM), a nonvolatile memory (NVM) and the logic die is a logic device, such as but not limited to a microprocessor and a digital signal processor.

In accordance with an embodiment of the present invention, one or more of die interconnect structures 612, plurality of bumps 620, or first level interconnects 614 is composed of an array of metal bumps. In one embodiment, each metal bump is composed of a metal such as, but not limited to, copper, gold, or nickel. Substrate 902 may be a flexible substrate or a rigid substrate, depending upon the specific application. In an embodiment, substrate 602 has a plurality of electrical traces disposed therein. In an embodiment, an external contact layer is also formed. In one embodiment, the external contact layer includes a ball grid array (BGA). In other embodiments, the external contact layer includes an array such as, but not limited to, a land grid array (LGA) or an array of pins (PGA).

With respect to molding layer 616, several options may be used to fabricate the layer. In an embodiment, an FLI bump and bottom-die over-mold approach is used. In one embodiment, the over-mold layer is subsequently grinded back to expose the FLI bumps. In one embodiment, grind back is performed close to the bump (e.g., copper bump) and then laser ablation is used to open the copper bumps. Subsequently, solder paste print or micro-ball attach is performed onto the copper bumps. In one embodiment, directly laser open of the copper bumps is performed without any grind back. A solder operation may similarly be performed as above. In another embodiment, bump and bottom die molding are exposed with a polymer film above the FLI bumps and bottom die. No bump exposure is needed; however, cleaning of the FLI Cu bump may be needed by plasma, or laser, etc. In another embodiment, transfer or compression mold is used. In another embodiment, capillary underfill layer formation is extended to cover the FLI bumps in instead of conventional molding. The molding layer 616 may be composed of a non-conductive material. In one embodiment, the molding layer 616 is composed of a material such as, but not limited to, a plastic or an epoxy resin composed of silica fillers.

Figure 7:
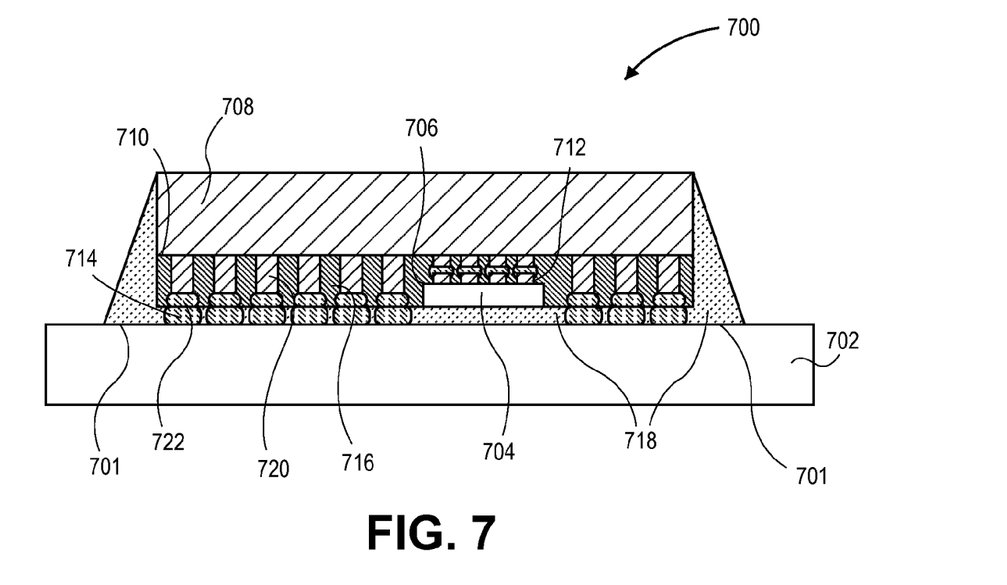
FIG. 7 illustrates a cross-sectional view of a 3D integrated circuit package with through-mold first level interconnects and including microstrip routing and a metal plane to accommodate for an epoxy fillet crack, in accordance with an embodiment of the present invention.

In a second example, referring to FIG. 7, a semiconductor package 700 includes a substrate 702. A bottom semiconductor die 704 has an active side 706 with a surface area. The bottom semiconductor die 704 is coupled to the substrate 702 with the active side 706 distal from the substrate 702. A top semiconductor die 708 has an active side 710 with a surface area larger than the surface area of the bottom semiconductor die 704. The top semiconductor die 708 is coupled to the substrate 702 with the active side 710 proximate to the substrate 702. The active side 706 of the bottom semiconductor die 704 is facing and conductively coupled to the active side 710 of the top semiconductor die 708 by die to die interconnect structures 712. The top semiconductor die 708 is conductively coupled to the substrate 702 by first level interconnects 714 that bypass the bottom semiconductor die 704. The top semiconductor die 708 is further conductively coupled to the substrate 702 by a plurality of bumps 720 that extend from the active side 710 of the top semiconductor die 708, and at least partially adjacent to the bottom semiconductor die 704, to a plurality of solder balls 722. The plurality of solder balls 722 is coupled to the first level interconnects 714. In an embodiment, the bottom semiconductor die 704, the plurality of bumps 720, and the plurality of solder balls 722 are housed in a molding layer 716, as depicted in FIG. 7. In an embodiment, the top semiconductor die 708 and the bottom semiconductor die 704 are further coupled to the substrate 702 by an epoxy fillet material 718, as is also depicted in FIG. 7. In one embodiment, regions 701 for inclusion of discrete metal planes to arrest crack propagation, as well as regions for outer-die-perimeter microstrip routing are provided in the substrate 702. Additionally, a partial trench may be included in a solder mask to provide a keep out zone for epoxy fillet flow, e.g., during underfill.

Thus, in reference to FIG. 7, another approach for a 3D IC with through-mold FLI includes disposing solder inside a molding layer. The solder may be placed before molding and then exposed by grind back or laser open. Alternatively, solder paste may be placed after laser opening through copper bumps. The characteristics and configurations of the packaged die and the materials of package 700 may be the same or similar to those described above for package 600. In an embodiment, the solder balls 722 are composed of lead or are lead free, such as alloys of gold and tin solder or silver and tin solder.

In reference to FIGS. 6 and 7, mixed FLI bump heights may be used for a top semiconductor die. For example, in one embodiment, a mixed height FLI bump is created by using a top-hat or a slender copper column bumping process. Here, the first bumping mask and plating operation provides short bump heights for both FLI and LMI. The second bumping mask and plating operation provides only the FLI bumps as taller. It is to be understood that various combinations of copper and solder bumping may be performed for FLI, as shown FIGS. 6 and 7.

In another aspect of the present invention, coreless substrates with embedded stacked through-silicon via die are contemplated. For example, a semiconductor die with C4 solder ball connections may be packaged in a Bumpless Build-Up Layer or BBUL processor packaging technology. Such a process is bumpless since it does not use the usual tiny solder bumps to attach the silicon die to the processor package wires. It has build-up layers since it is grown or built-up around the silicon die. Additionally, some semiconductor packages now use a coreless substrate, which does not include the thick resin core layer commonly found in conventional substrates. In an embodiment, as part of the BBUL process, electrically conductive vias and routing layers are formed above the active side of a semiconductor die using a semi-additive process (SAP) to complete remaining layers. In an embodiment, an external contact layer is formed. In one embodiment, an array of external conductive contacts is a ball grid array (BGA). In other embodiments, the array of external conductive contacts is an array such as, but not limited to, a land grid array (LGA) or an array of pins (PGA). In an embodiment, a large die is packaged through a BBUL process. At an interface of the BBUL package and a receiving substrate, an epoxy fillet material may be used for underfill. In one such embodiment, discrete metal planes are provided in the receiving substrate to arrest crack propagation. As well, outer-die-perimeter microstrip routing is provided in the receiving substrate. Additionally, a partial trench may be included in a solder mask to provide a keep out zone for epoxy fillet flow, e.g., during underfill.

Figure 8:
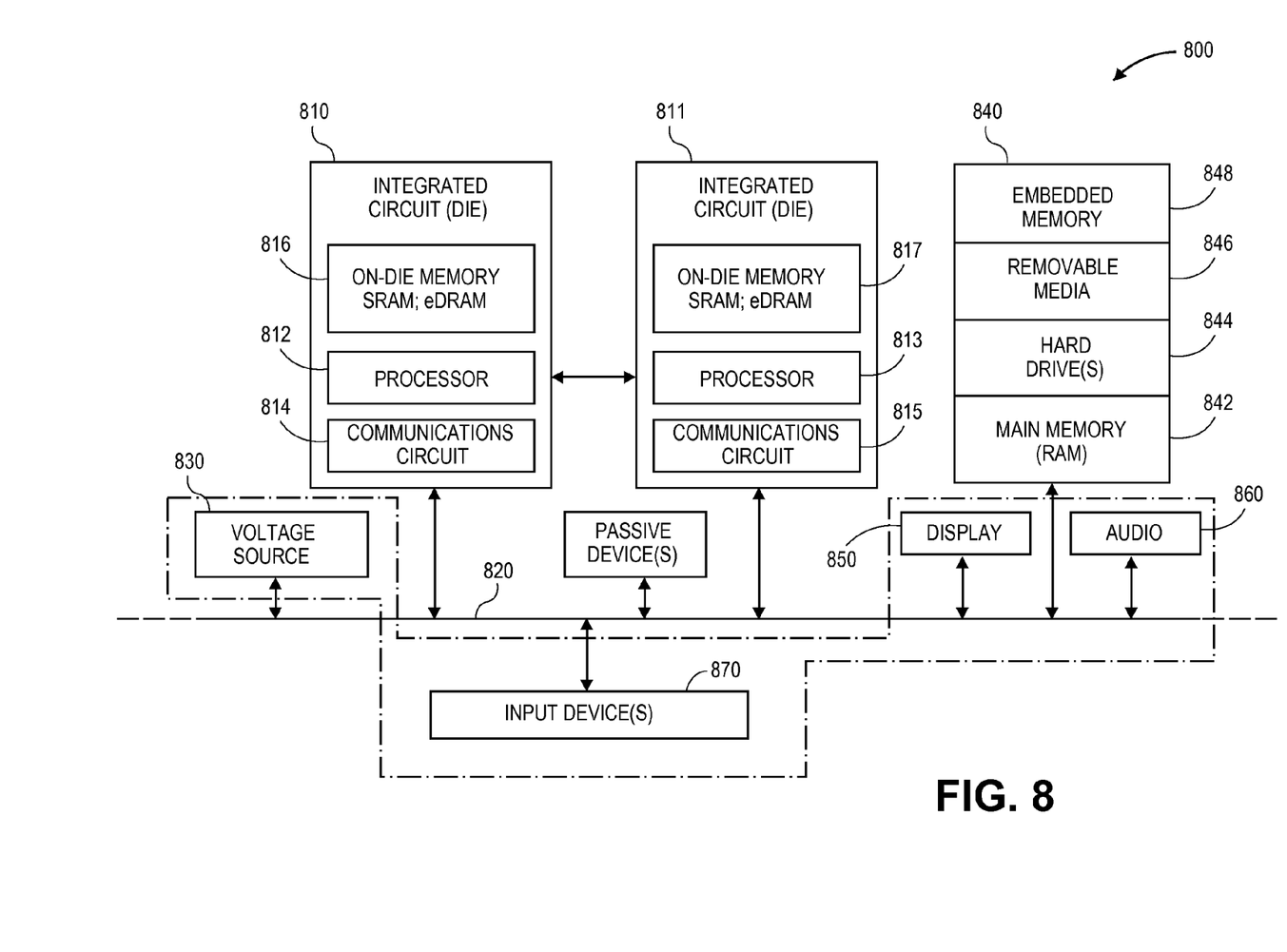
FIG. 8 is a schematic of a computer system, in accordance with an embodiment of the present invention.

FIG. 8 is a schematic of a computer system 800, in accordance with an embodiment of the present invention. The computer system 800 (also referred to as the electronic system 800) as depicted can embody reliable microstrip routing for dense multi-chip-package interconnects according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, reliable microstrip routing for dense multi-chip-package interconnects, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including reliable microstrip routing for dense multi-chip-package interconnects according to any of the several disclosed embodiments and their equivalents, an electronic system, a computer system, one or more methods of fabricating an integrated circuit, and one or more methods of fabricating an electronic assembly that includes reliable microstrip routing for dense multi-chip-package interconnects according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed reliable microstrip routing for dense multi-chip-package interconnects embodiments and their equivalents. A foundation substrate may be included, as represented by the dashed line of FIG. 8. Passive devices may also be included, as is also depicted in FIG. 8.

Embodiments of the present invention include reliable microstrip routing arrangements for electronics components.

In an embodiment, a semiconductor apparatus includes a semiconductor die having a surface with an integrated circuit thereon coupled to contact pads of an uppermost metallization layer of a semiconductor package substrate by a plurality of conductive contacts. A plurality of discrete metal planes is disposed at the uppermost metallization layer of the semiconductor package substrate, each metal plane located, from a plan view perspective, at a corner of a perimeter of the semiconductor die. Microstrip routing is disposed at the uppermost metallization layer of the semiconductor package substrate, from the plan view perspective, outside of the perimeter of the semiconductor die.

In one embodiment, the semiconductor apparatus further includes an epoxy fillet layer disposed between the surface of the semiconductor die and the semiconductor package substrate and surrounding the plurality of conductive contacts.

In one embodiment, the plurality of discrete metal planes is for arresting propagation of one or more cracks from the epoxy fillet layer or a solder resist SR layer under the epoxy fillet or a die corner.

In one embodiment, the semiconductor apparatus further includes a crack in the epoxy fillet layer, and propagation of the crack is arrested at one of the plurality of discrete metal planes.

In one embodiment, the semiconductor apparatus further includes a solder resist disposed on the uppermost metallization layer of the semiconductor package substrate and surrounding the plurality of conductive contacts, and the epoxy fillet layer is disposed on the solder resist.

In one embodiment, the semiconductor apparatus further includes a trench formed in the solder resist, from the plan view perspective, outside of the perimeter of the semiconductor die, the trench providing a keep out zone for the epoxy fillet layer.

In one embodiment, the trench is formed only partially into the solder resist, and, from the plan view perspective, a portion of the microstrip routing is underneath the trench.

In one embodiment, the solder resist includes a first solder resist layer disposed on a second solder resist layer, and the trench is disposed in the first solder resist layer but not in the second solder resist layer.

In an embodiment, a semiconductor package includes first and second adjacent semiconductor dies. A silicon bridge structure electrically couples the first and second semiconductor dies, and includes a plurality of layers of conductive traces disposed above a substrate, a first pair of ground traces disposed in a first of the plurality of layers of conductive traces, a signal trace disposed in a second of the plurality of layers of conductive traces, below the first layer, and a second pair of ground traces disposed in a third of the plurality of layers of conductive traces, below the first layer. The semiconductor package also includes a plurality of package routing layers, and the silicon bridge structure is disposed in one of the package routing layers. The first and second die are disposed on the plurality of package routing layers, and the first die is electrically coupled to an uppermost metallization layer of the plurality of package routing layers by a plurality of conductive contacts. One or more discrete metal planes is disposed at the uppermost metallization layer, each metal plane located, from a plan view perspective, at a corner of a perimeter of the first die. The semiconductor package also includes microstrip routing disposed at the uppermost metallization layer, from the plan view perspective, outside of the perimeter of the first die.

In one embodiment, the semiconductor package further includes an epoxy fillet layer disposed between the first die and the uppermost metallization layer and surrounding the plurality of conductive contacts.

In one embodiment, one or more discrete metal planes is for arresting propagation of one or more from the epoxy fillet layer or a solder resist SR layer under the epoxy fillet or a die corner.

In one embodiment, the semiconductor package further includes a crack in the epoxy fillet layer, and propagation of the crack is arrested at one of the one or more discrete metal planes.

In one embodiment, the semiconductor package further includes a solder resist disposed on the uppermost metallization layer and surrounding the plurality of conductive contacts, and the epoxy fillet layer is disposed on the solder resist.

In one embodiment, the semiconductor package further includes a trench formed in the solder resist, from the plan view perspective, outside of the perimeter of the first die, the trench providing a keep out zone for the epoxy fillet layer.

In one embodiment, the trench is formed only partially into the solder resist, and, from the plan view perspective, a portion of the microstrip routing is underneath the trench.

In one embodiment, the solder resist includes a first solder resist layer disposed on a second solder resist layer, and the trench is disposed in the first solder resist layer but not in the second solder resist layer.

In an embodiment, a semiconductor package includes first and second adjacent semiconductor dies. A silicon interposer structure is disposed below and electrically coupling the first and second semiconductor dies. An organic package substrate is disposed below and electrically coupled to the silicon interposer structure by a plurality of conductive contacts. The organic package substrate includes a plurality of routing layers therein. A plurality of discrete metal planes is disposed at an uppermost metallization layer of the plurality of routing layers of the organic package substrate, each metal plane located, from a plan view perspective, at a corner of a perimeter of the silicon interposer structure. Microstrip routing is disposed at the uppermost metallization layer of the plurality of routing layers of the organic package substrate, from the plan view perspective, outside of the perimeter of the silicon interposer structure.

In one embodiment, the semiconductor package further includes an epoxy fillet layer disposed between the silicon interposer structure and the organic package substrate and surrounding the plurality of conductive contacts.

In one embodiment, the plurality of discrete metal planes is for arresting propagation of one or more from the epoxy fillet layer or a solder resist SR layer under the epoxy fillet or a die corner.

In one embodiment, the semiconductor package further includes a crack in the epoxy fillet layer, and propagation of the crack is arrested at one of the plurality of discrete metal planes.

In one embodiment, the semiconductor package further includes a solder resist disposed on the uppermost metallization layer and surrounding the plurality of conductive contacts, and the epoxy fillet layer is disposed on the solder resist.

In one embodiment, the semiconductor package further includes a trench formed in the solder resist, from the plan view perspective, outside of the perimeter of the silicon interposer structure, the trench providing a keep out zone for the epoxy fillet layer.

In one embodiment, the trench is formed only partially into the solder resist, and, from the plan view perspective, a portion of the microstrip routing is underneath the trench.

In one embodiment, the solder resist includes a first solder resist layer disposed on a second solder resist layer, and the trench is disposed in the first solder resist layer but not in the second solder resist layer.

In one embodiment, the organic package substrate is electrically coupled to the silicon interposer structure by one or more through-silicon-vias (TSVs) disposed in the silicon interposer structure.

What is claimed is:

1. A semiconductor apparatus, comprising:
a semiconductor die having a surface with an integrated circuit thereon coupled to contact pads of an uppermost metallization layer of a semiconductor package substrate by a plurality of conductive contacts;
a plurality of discrete metal planes disposed at the uppermost metallization layer of the semiconductor package substrate, each metal plane located, from a plan view perspective, at a corner of a perimeter of the semiconductor die; and
microstrip routing disposed at the uppermost metallization layer of the semiconductor package substrate, from the plan view perspective, outside of the perimeter of the semiconductor die.

2. The semiconductor apparatus of claim 1, further comprising:
an epoxy fillet layer disposed between the surface of the semiconductor die and the semiconductor package substrate and surrounding the plurality of conductive contacts.

3. The semiconductor apparatus of claim 2, wherein the plurality of discrete metal planes is for arresting propagation of one or more from the epoxy fillet layer or a solder resist SR layer under the epoxy fillet or a die corner.

4. The semiconductor apparatus of claim 2, further comprising:
a crack in the epoxy fillet layer or a solder resist SR layer under the epoxy fillet or a die corner, wherein propagation of the crack is arrested at one of the plurality of discrete metal planes.

5. The semiconductor apparatus of claim 2, further comprising:
a solder resist disposed on the uppermost metallization layer of the semiconductor package substrate and surrounding the plurality of conductive contacts, wherein the epoxy fillet layer is disposed on the solder resist.

6. The semiconductor apparatus of claim 5, further comprising:
a trench formed in the solder resist, from the plan view perspective, outside of the perimeter of the semiconductor die, the trench providing a keep out zone for the epoxy fillet layer.

7. The semiconductor apparatus of claim 6, wherein the trench is formed only partially into the solder resist, and wherein, from the plan view perspective, a portion of the microstrip routing is underneath the trench.

8. The semiconductor apparatus of claim 7, wherein the solder resist comprises a first solder resist layer disposed on a second solder resist layer, and wherein the trench is disposed in the first solder resist layer but not in the second solder resist layer.

* * * * *